US012713511B2

(12) United States Patent
Ma et al.

(10) Patent No.: US 12,713,511 B2
(45) **Date of Patent: *Aug. 18, 2026**

(54) APPARATUS FOR AND METHOD OF REDUCING CONTAMINATION FROM SOURCE MATERIAL IN AN EUV LIGHT SOURCE

(71) Applicant: ASML Netherlands B.V., Veldhoven (NL)

(72) Inventors: Yue Ma, Escondido, CA (US); Dzmitry Labetski, Eindhoven (NL); Andrew David LaForge, Poway, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/528,933

(22) Filed: Dec. 5, 2023

(65) Prior Publication Data

US 2024/0103387 A1 Mar. 28, 2024

Related U.S. Application Data

(63) Continuation of application No. 17/283,722, filed as application No. PCT/US2019/057256 on Oct. 21, 2019, now Pat. No. 11,874,608.

(Continued)

(51) Int. Cl.

*H05G 2/00* (2006.01)
*G03F 7/00* (2006.01)

(52) U.S. Cl.

CPC ....... *H05G 2/0094* (2024.08); *G03F 7/70033* (2013.01); *G03F 7/70858* (2013.01)

(58) Field of Classification Search

CPC .. G03F 7/70858; G03F 7/70033; H05G 2/008

See application file for complete search history.

(56) References Cited

U.S. PATENT DOCUMENTS 6,724,460 B2 4/2004 Van Schaik et al.
9,557,650 B2 1/2017 De Dea et al.

(Continued)

FOREIGN PATENT DOCUMENTS

CN 102621817 A 8/2012
CN 105981482 A 9/2016

(Continued)

OTHER PUBLICATIONS

Christopher Smith, European International Searching Authority, International Search Report and Written Opinion, corresponding PCT Application No. PCT/US2019/057256, mailed Feb. 13, 2020, 8 pages total.

(Continued)

*Primary Examiner* — Georgia Y Epps
*Assistant Examiner* — Hanway Chang
(74) *Attorney, Agent, or Firm* — DiBerardino McGovern IP Group LLC

(57) ABSTRACT

Disclosed is a source for and method of generating extreme ultraviolet radiation in which spitting of molten target material is hindered through depletion of the number of hydrogen radicals available to enter deposits of molten target material and create hydrogen bubbles therein by introducing an active gas that reacts with the hydrogen radicals.

20 Claims, 5 Drawing Sheets

Related U.S. Application Data

(60) Provisional application No. 62/748,735, filed on Oct. 22, 2018.

(56) References Cited

U.S. PATENT DOCUMENTS

| | | | |
|---|---|---|---|
| 9,606,445 | B2 | 3/2017 | Banine et al. |
| 10,034,362 | B2 | 7/2018 | Kuritsyn et al. |
| 10,073,361 | B2 | 9/2018 | Ehm et al. |
| 10,232,413 | B2 | 3/2019 | De Dea et al. |
| 11,874,608 | B2 * | 1/2024 | Ma ...................... G03F 7/70858 |
| 2008/0001101 | A1 | 1/2008 | Wilhelmus Van Herpen et al. |
| 2008/0099699 | A1 | 5/2008 | Yabuta et al. |
| 2011/0226745 | A1 | 9/2011 | Nagai et al. |
| 2018/0160517 | A1 | 6/2018 | Baek et al. |
| 2020/0008290 | A1 * | 1/2020 | Su ............................ G21K 1/06 |

FOREIGN PATENT DOCUMENTS

| | | | | |
|---|---|---|---|---|
| CN | 108472497 | A | 8/2018 | |
| DE | 102016125695 | A1 | 1/2018 | |
| JP | 2005332972 | A | 12/2005 | |
| JP | 2008108945 | A | 5/2008 | |
| JP | 2018500601 | A | 11/2018 | |
| WO | 2009032055 | A1 | 3/2009 | |
| WO | WO-2015055374 | A1 * | 4/2015 | ......... G03F 7/70033 |
| WO | 2018127565 | A2 | 7/2018 | |
| WO | 2019170503 | A1 | 9/2019 | |

OTHER PUBLICATIONS

Jones et al., "Kinetics of atomic hydrogen reactions in the gas phase," Chemical Reviews, vol. 73, No. 5, pp. 407-440 (1973), doi:10.1021/cr60285a001.

Sporre et al., "Collector optic in-situ Sn removal using hydrogen plasma," Proc. SPIE 8679, Extreme Ultraviolet (EUV) Lithography IV, 86792H (Apr. 8, 2013), doi:10.1117/12.2012584.

* cited by examiner

APPARATUS FOR AND METHOD OF REDUCING CONTAMINATION FROM SOURCE MATERIAL IN AN EUV LIGHT SOURCE

CROSS REFERENCE TO RELATED APPLICATIONS

This application is a continuation of U.S. application Ser. No. 17/283,722, filed Apr. 8, 2021, which is a national phase of International Application No. PCT/US2019/057256, filed Oct. 21, 2019 and titled APPARATUS FOR AND METHOD OF REDUCING CONTAMINATION FROM SOURCE MATERIAL IN AN EUV LIGHT SOURCE, which claims priority to U.S. Application No. 62/748,735, filed Oct. 22, 2018 and titled APPARATUS FOR AND METHOD OF REDUCING CONTAMINATION FROM SOURCE MATERIAL IN AN EUV LIGHT SOURCE. Each of these patent applications is incorporated herein by reference in its entirety.

TECHNICAL FIELD

The present disclosure relates to apparatus for and methods of generating extreme ultraviolet ("EUV") radiation from a plasma created through discharge or laser ablation of a source or target material in a vessel. In such applications optical elements are used, for example, to collect and direct the radiation for use in semiconductor photolithography and inspection.

BACKGROUND

Extreme ultraviolet radiation, e.g., electromagnetic radiation having wavelengths of around 50 nm or less (also sometimes referred to as soft x-rays), and including radiation at a wavelength of about 13.5 nm, can be used in photolithography processes to produce extremely small features in substrates such as silicon wafers.

Methods for generating EUV radiation include converting a target material to a plasma state. The target material preferably includes at least one element, e.g., xenon, lithium or tin, with one or more emission lines in the EUV portion of the electromagnetic spectrum. The target material can be solid, liquid, or gas. In one such method, often termed laser produced plasma ("LPP"), the required plasma can be produced by using a laser beam to irradiate a target material having the required line-emitting element.

One LPP technique involves generating a stream of target material droplets and irradiating at least some of the droplets with one or more laser radiation pulses. Such LPP sources generate EUV radiation by coupling laser energy into a target material having at least one EUV emitting element, creating a highly ionized plasma with electron temperatures of several 10's of eV.

For this process, the plasma is typically produced in a sealed vessel, e.g., a vacuum chamber, and the resultant EUV radiation is monitored using various types of metrology equipment. In addition to generating EUV radiation, the processes used to generate plasma also typically generate undesirable by-products in the plasma chamber which can include out-of-band radiation, high energy ions, and debris, e.g., atoms and/or clumps/microdroplets of residual target material.

The energetic radiation is emitted from the plasma in all directions. In one common arrangement, a near-normal-incidence mirror (often termed a "collector mirror" or simply a "collector") is positioned to collect, direct, and, in some arrangements, focus at least a portion of the radiation to an intermediate location. The collected radiation may then be relayed from the intermediate location to a set of optics, a reticle, detectors and ultimately to a silicon wafer.

In the EUV portion of the spectrum it is generally regarded as necessary to use reflective optics for the optical elements in the system including the collector, illuminator, and projection optics box. These reflective optics may be implemented as normal incidence optics as mentioned or as grazing incidence optics. At the wavelengths involved, the collector is advantageously implemented as a multi-layer mirror ("MLM"). As its name implies, this MLM is generally made up of alternating layers of material (the MLM stack) over a foundation or substrate. System optics may also be configured as coated optical elements even if they are not implemented as an MLM.

The optical elements and, in particular, the collector must be placed within the vessel with the plasma to collect and redirect the EUV radiation. The environment within the chamber is inimical to the optical elements and so limits their useful lifetime, for example, by degrading reflectivity. An optical element within the environment may be exposed to high energy ions or particles of target material. The particles of target material, which are essentially debris from the laser vaporization process, can contaminate the optical element's exposed surface. Particles of target material can also cause physical damage to and localized heating of the MLM surface.

In some systems $H_2$ gas at pressures in the range of about 0.5 to about 3 mbar is used in the vacuum chamber as a buffer gas for debris mitigation. In the absence of a gas, at vacuum pressure, it would be difficult to protect the collector adequately from target material debris ejected from the irradiation region. Hydrogen is relatively transparent to EUV radiation having a wavelength of about 13.5 nm and so is preferred to other candidate gases such as He, Ar, or other gases which exhibit a higher absorption at about 13.5 nm.

$H_2$ gas is introduced into the vacuum chamber to slow down the energetic debris (ions, atoms, and clusters) of target material created by the plasma. The debris is slowed down by collisions with the gas molecules. For this purpose a flow of $H_2$ gas is used which may also be counter to the debris trajectory and away from the collector. This serves to reduce the damage of deposition, implantation, and sputtering target material on the optical coating of the collector.

Still, one of the most challenging problems in a source such as that described is management of residual target material. The process of transforming the target material creates particles and deposits residual target material on surfaces where there is an unobstructed path between the irradiation site and the surface as well as in the exhaust path of gases that entrain residual target material. For example, if this gas is pumped across the top of vanes present in the chamber and to the mechanical pumps then soon the material is deposited on all of the cold metal parts. If the target material is tin, then this can lead to the growth of tin wool which can drop onto the collector optics and clog the exhaust paths.

Still using tin as an example of a target material, one technique for controlling tin dispersal involves capturing tin from vapor or particles on a surface heated to above the meting point of tin. There the tin melts (or remains molten) and is caused to flow to a capture receptacle. Liquid tin, however, tends to erupt or "spit" in the presence of hydrogen radicals such as are found in an EUV chamber, and this ejected tin can strike the collector. This is a major contributor to collector degradation.

Tin spitting occurs when H radicals (H*) diffuse into liquid tin, where some of the H radicals recombine into hydrogen gas, forming bubbles in the liquid tin. The bubbles grow as the H* radicals continue to feed into liquid tin and recombine there, until an equilibrium is reached among these parameters: H* saturation on the surface of the molten tin (gauged by the solubility of H* at a given partial pressure of H* in its gaseous phase); the capillary pressure in the $H_2$ bubble; the surface tension of molten tin (which is related to the temperature of the molten tin); and the $H_2$ partial pressure in the gas phase. Further H* recombination causes the $H_2$ bubbles in the molten tin to burst. The bursting of an $H_2$ bubble ejects or spits out globules of molten tin.

Tin debris from the source vessel can pass through intermediate focus from an EUV source to the scanner, which can cause contamination of, for example, an illuminator in scanner, an expensive optical element whose lifetime is critical to EUV system productivity and cost of ownership. As described above, one form of tin contamination is the ejection or "spitting" of molten tin from walls near the intermediate focus in the source vessel. One technique used to prevent tin debris from reaching the scanner involves applying a dynamic gas lock at the intermediate focus to suppress tin contamination as disclosed in U.S. Pat. No. 9,606,445 issued Mar. 28, 2017 and titled "Lithographic Apparatus and Method of Manufacturing a Device," the entire contents of which are hereby incorporated by reference.

The process of generating EUV light may also cause target material to be deposited on the walls of the vessel. Controlling target material deposition on the vessel walls is important for achieving an acceptably long lifetime of EUV sources placed in production. Also, managing target material flux from the irradiation site is important for ensuring that the waste target material mitigation system works as intended.

SUMMARY

The following presents a simplified summary of one or more embodiments in order to provide a basic understanding of the embodiments. This summary is not an extensive overview of all contemplated embodiments and is not intended to identify key or critical elements of all embodiments nor set limits on the scope of any or all embodiments. Its sole purpose is to present some concepts of one or more embodiments in a simplified form as a prelude to the more detailed description that is presented later.

According to one aspect of an embodiment, there is disclosed a source for and method of generating extreme ultraviolet radiation in which spitting of molten target material is hindered through depletion of the number of hydrogen radicals available to enter deposits of molten target material and create hydrogen bubbles therein by introducing an active gas that reacts with and consumes the hydrogen radicals.

According to another aspect of an embodiment there is disclosed an apparatus for generating EUV radiation, the apparatus comprising a vessel, a collector mirror positioned within the vessel, the collector mirror having an optical axis, a primary focus located in the vessel and on the optical axis, and an intermediate focus on the optical axis, at least one exhaust port positioned in a side wall of the vessel beside a first position on the optical axis between the primary focus and the intermediate focus, and at least one inlet adapted to be placed in fluid communication with a source of a gas that combines with hydrogen radicals and positioned in the side wall beside a second position on the optical axis between the intermediate focus and first position. The gas may comprise oxygen. The gas may comprise molecular oxygen. The gas may comprise oxygen radicals. The gas may comprise methane. The gas may comprise molecules of one of CO, $CO_2$, a halogen, acetone vapor, $H_2S$, $NO_2$, $N_2$, $NH_3$, $H_2O$, hydrazine, and $NF_3$. The gas may comprise radicals of one of CO, $CO_2$, a halogen, acetone vapor, $H_2S$, $NO_2$, $N_2$, $NH_3$, $H_2O$, hydrazine, and $NF_3$. A partial pressure of the gas may be in the range of about 10E-4 mbar to about 10E-2 mbar.

According to another aspect of an embodiment there is disclosed an apparatus for generating EUV radiation, the apparatus comprising a vessel, a collector mirror positioned within the vessel, the collector mirror having an optical axis and a primary focus located in the vessel and on the optical axis, and an intermediate focus on the optical axis, at least one exhaust port positioned in a side wall of the vessel beside a first position on the optical axis between the primary focus and the intermediate focus, and at least one inlet adapted to be placed in fluid communication with a source of a gas that combines with hydrogen radicals and positioned in the side wall closer to the exhaust port than to the primary focus. The gas may comprise oxygen. The gas may comprise molecular oxygen. The gas may comprise oxygen radicals. The gas may comprise methane. The gas may comprise molecules of one of CO, $CO_2$, a halogen, acetone vapor, $H_2S$, $NO_2$, $N_2$, $NH_3$, $H_2O$, hydrazine, and $NF_3$. The gas may comprise radicals of one of CO, $CO_2$, a halogen, acetone vapor, $H_2S$, $NO_2$, $N_2$, $NH_3$, $H_2O$, hydrazine, and NF 3. A partial pressure of the gas may be in the range of about 10E-4 mbar to about 10E-2 mbar.

According to another aspect of an embodiment there is disclosed a method of decreasing a partial pressure of hydrogen radicals in a region in a vessel in an EUV source having a reflective optical element in the vessel, the reflective optical element having a primary focus, the method comprising the steps of introducing an active gas in the region to participate in a reaction with the hydrogen radicals in which the hydrogen radicals are consumed, and exhausting the active gas and products of the reaction from the vessel at a position between the region and the primary focus. The gas may comprise methane. The gas may comprise molecules of one of CO, $CO_2$, a halogen, acetone vapor, $H_2S$, $NO_2$, $N_2$, $NH_3$, $H_2O$, hydrazine, and $NF_3$. The gas may comprise radicals of one of CO, $CO_2$, a halogen, acetone vapor, $H_2S$, $NO_2$, $N_2$, $NH_3$, $H_2O$, hydrazine, and $NF_3$. A partial pressure of the gas may be in the range of about 10E-4 mbar to about 10E-2 mbar.

Further embodiments, features, and advantages of the present invention, as well as the structure and operation of the various embodiments are described in detail below with reference to accompanying drawings.

Figure 1:
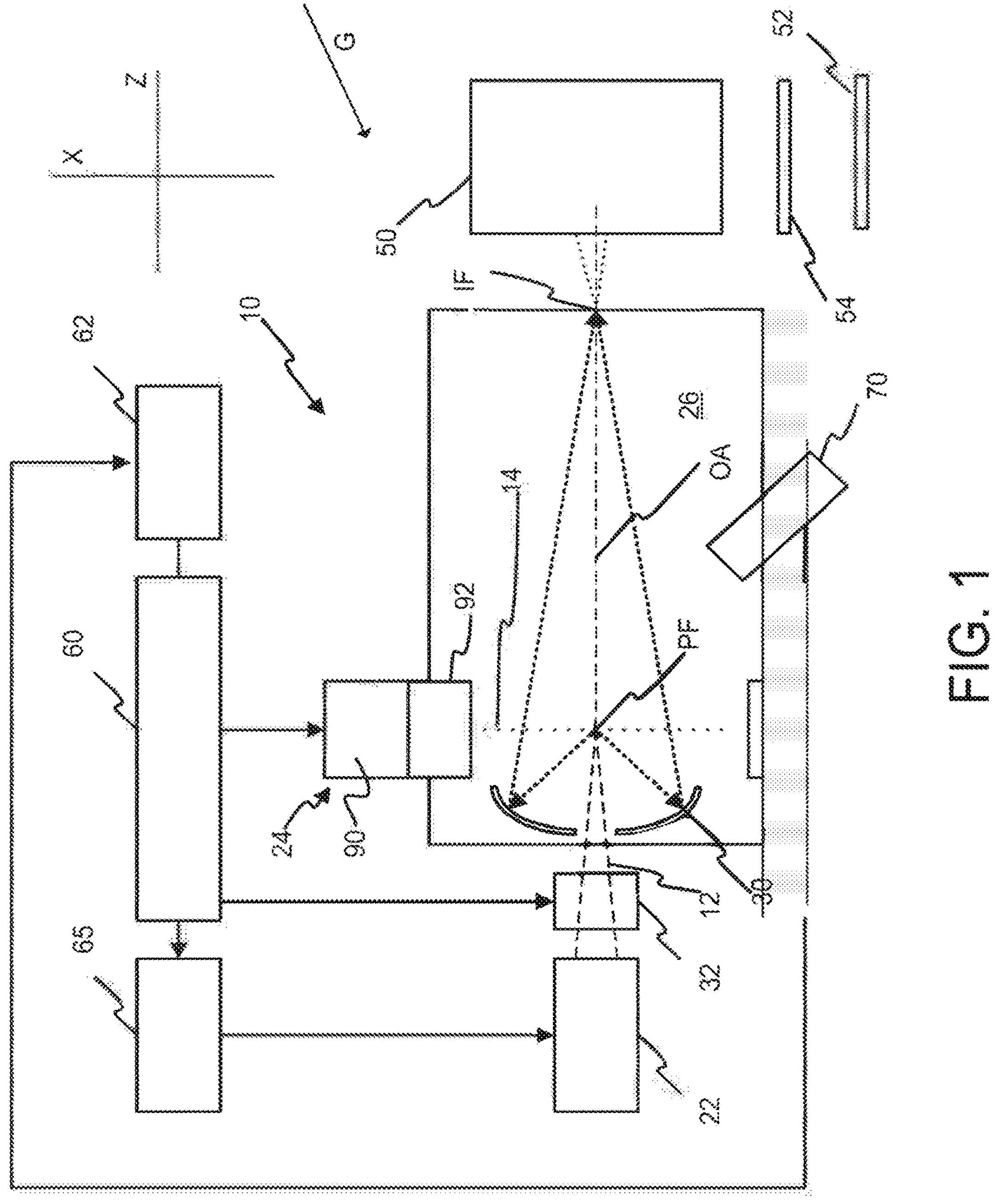
FIG. 1 is a schematic, not-to-scale view of an overall broad conception for a laser-produced plasma EUV radiation source system according to an aspect of an embodiment.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments.

Before describing such embodiments in more detail, however, it is instructive to present an example environment in which embodiments of the present invention may be implemented. In the description that follows and in the claims the terms "up," "down," "top," "bottom," "vertical," "horizontal," and like terms may be employed. These terms are intended to show relative orientation only and not any orientation with respect to gravity unless otherwise indicated.

With initial reference to FIG. 1 there is shown a schematic view of an exemplary EUV radiation source, e.g., a laser produced plasma EUV radiation source 10 according to one aspect of an embodiment of the present invention. As shown, the EUV radiation source 10 may include a pulsed or continuous laser source 22, which may for example be a pulsed gas discharge $CO_2$ laser source producing a beam 12 of radiation at 10.6 μm or 1 μm. The pulsed gas discharge $CO_2$ laser source may have DC or RF excitation operating at high power and at a high pulse repetition rate.

The EUV radiation source 10 also includes a target delivery system 24 for delivering target material in the form of liquid droplets or a continuous liquid stream. In this example, the target material is a liquid, but it could also be a solid or gas. The target material may be made up of tin or a tin compound, although other materials could be used. In the system depicted the target material delivery system 24 introduces droplets 14 of the target material into the interior of a vacuum chamber 26 to an irradiation region at the primary focus (PF) of the collector 30 where the target material may be irradiated to produce plasma. The vacuum chamber 26 may be provided with a liner. In some cases, an electrical charge is placed on the target material to permit the target material to be steered toward or away from the irradiation region. It should be noted that as used herein an irradiation region is a region where target material irradiation may or is intended to occur, and is an irradiation region even at times when no irradiation is actually occurring. The EUV light source may also include a beam steering system 32.

In the system shown, the components are arranged so that the droplets 14 travel substantially horizontally. The direction from the laser source 22 towards the irradiation region, that is, the nominal direction of propagation of the beam 12, may be taken as the Z axis. The path the droplets 14 take from the target material delivery system 24 to the irradiation region may be taken as the X axis. The view of FIG. 1 is thus normal to the XZ plane. The orientation of the EUV radiation source 10 is preferably rotated with respect to gravity as shown, with the arrow G showing the preferred orientation with respect to gravitationally down. This orientation applies to the EUV source but not necessarily to optically downstream components such as a scanner and the like. Also, while a system in which the droplets 14 travel substantially horizontally is depicted, it will be understood by one having ordinary skill in the art the other arrangements can be used in which the droplets travel vertically or at some angle with respect to gravity between and including 90 degrees (horizontal) and 0 degrees (vertical).

The EUV radiation source 10 may also include an EUV light source controller system 60, a laser firing control system 65, along with the beam steering system 32. The EUV radiation source 10 may also include a detector such as a target position detection system which may include one or more droplet imagers 70 that generate an output indicative of the absolute or relative position of a target droplet, e.g., relative to the irradiation region, and provide this output to a target position detection feedback system 62.

As shown in FIG. 1, the target material delivery system 24 may include a target delivery control system 90. The target delivery control system 90 is operable in response to a signal, for example, the target error described above, or some quantity derived from the target error provided by the system controller 60, to adjust paths of the target droplets 14 through the irradiation region. This may be accomplished, for example, by repositioning the point at which a target delivery mechanism 92 releases the target droplets 14. The droplet release point may be repositioned, for example, by tilting the target delivery mechanism 92 or by laterally translating the target delivery mechanism 92. The target delivery mechanism 92 extends into the chamber 26 and is preferably externally supplied with target material and a gas source to place the target material in the target delivery mechanism 92 under pressure.

Continuing with FIG. 1, the radiation source 10 may also include one or more optical elements. In the following discussion, a collector 30 is used as an example of such an optical element, but the discussion applies to other optical elements as well. The collector 30 may be a normal incidence reflector, for example, implemented as an MLM with additional thin barrier layers, for example $B_4C$, ZrC, $Si_3N_4$ or C, deposited at each interface to effectively block thermally-induced interlayer diffusion. Other substrate materials, such as aluminum (Al) or silicon (Si), can also be used. The collector 30 may be in the form of a prolate ellipsoid, with a central aperture to allow the laser radiation 12 to pass through and reach the irradiation region. The collector 30 may be, e.g., in the shape of a ellipsoid that as mentioned has a primary focus PF at the irradiation region and an intermediate focus IF on the optical axis OA of the collector 30 where the EUV radiation may be output from the EUV radiation source 10 and input to, e.g., an integrated circuit lithography scanner 50 which uses the radiation, for example, to process a silicon wafer workpiece 52 in a known manner using a reticle or mask 54. The silicon wafer workpiece 52 is then additionally processed in a known manner to obtain an integrated circuit device.

Figure 2:
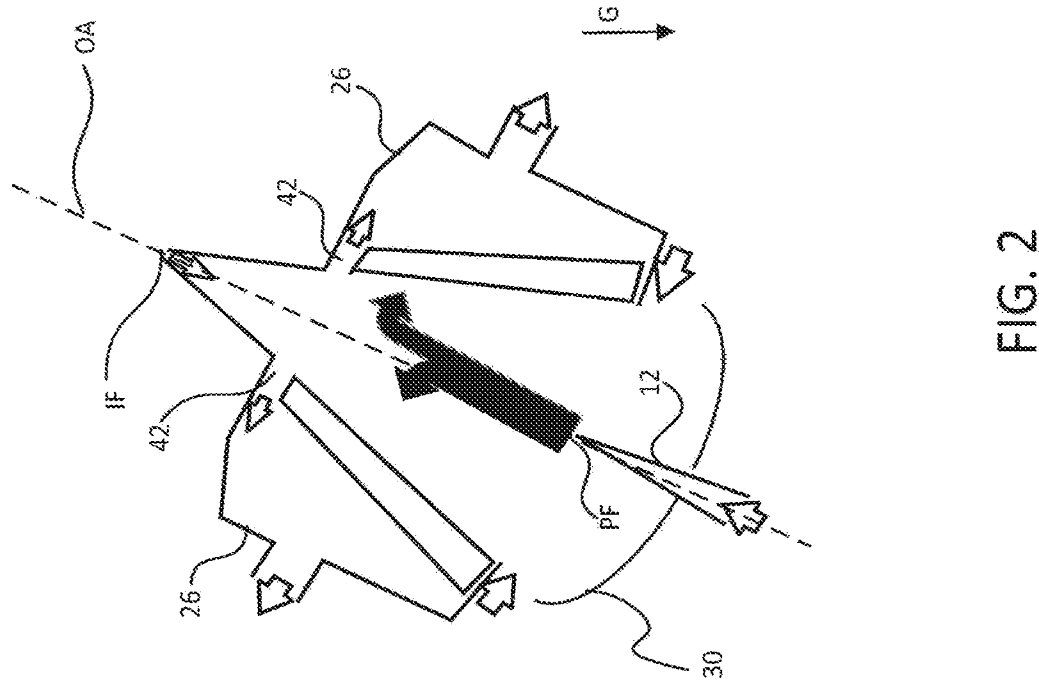
FIG. 2 is a not-to-scale diagram showing a possible arrangement of a vessel and exhaust systems used in a laser-produced plasma EUV radiation source system.
Figure 3B:
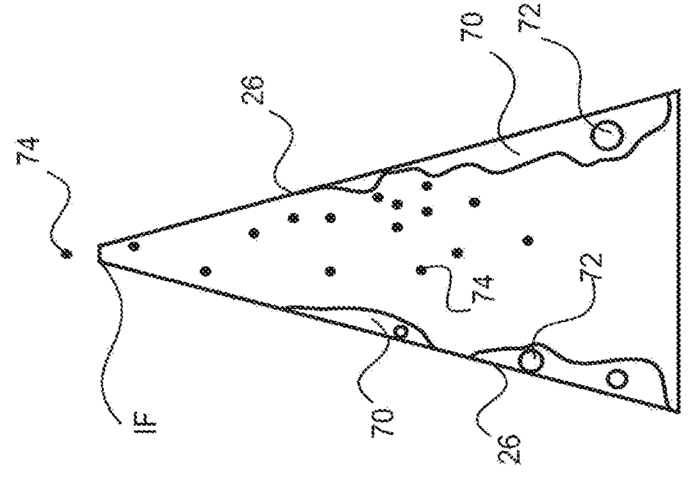
FIG. 3B is a not-to-scale cutaway schematic diagram of possible distribution of sources of contamination from spent target material.
Figure 3A:
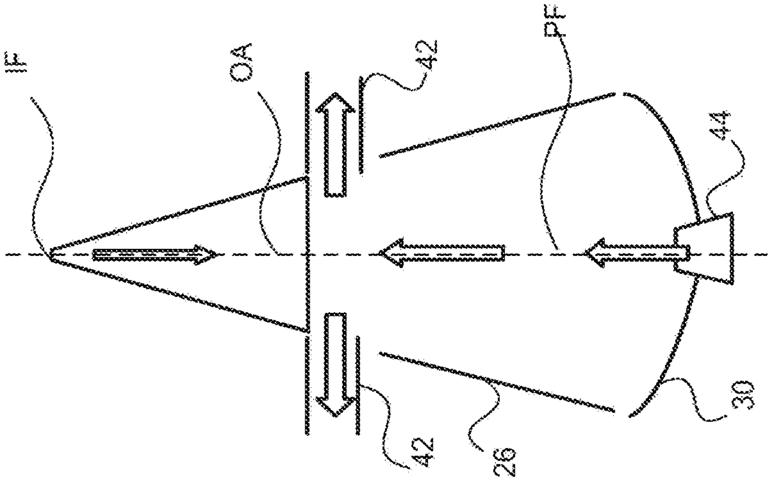
FIG. 3A is a not-to-scale cutaway schematic diagram of a possible arrangement of a vessel and exhaust systems according to an aspect of an embodiment.

The solid double arrow in FIG. 2 shows the direction of debris propagation. The outline arrows show a preferred arrangement for $H_2$ flow. Outlets 42 function as exhaust ports through which the $H_2$ exits the chamber 26. Arrow G indicates the direction of gravity. FIG. 3A is a schematic representation of this arrangement. As shown in FIG. 3A, hydrogen flows into the chamber 26 through an inlet 44 positioned in a central aperture of the collector 30 as well as from the top of the chamber 26 from a position near the intermediate focus IF. Also shown is the position of the primary focus PF of the collector 30 on its optical axis OA. Hydrogen flows away from the collector 30 and through outlets 42. Hydrogen entering from the top of the chamber 26 also flows through outlets 42.

As mentioned, tin spitting occurs when H radicals (H*) diffuse into liquid tin, where some of the H radicals recombine into hydrogen gas, forming bubbles in the liquid tin. Molten tin is released when the bubbles burst. Depending on conditions such as the size, velocity, and directionality of the unvaporized globules of liquid tin, some spitting tin can pass through the intermediate focus to reach the illuminator and other critical components in the scanner, even in the presence of a dynamic gas lock. This is shown schematically shown in FIG. 3B. In FIG. 3B, masses 70 of molten tin form on the walls of chamber 26. Hydrogen radicals in the chamber 26 penetrate these masses 70 of molten tin thus forming bubbles 72. These bubbles 72 have a tendency to burst thus releasing particles 74 of tin. Some of these particles 74 can escape the chamber 26 and contaminate downstream components.

Spitting is driven by the presence of two components, molten tin and hydrogen radicals H*. Because the tin spitting flux is directly related to H* flux, one way to reduce spitting flux is to reduce the partial pressure of H* in the region around and including the intermediate focus. The presence of H* in the region around and including the primary focus is beneficial to cleaning of the collector, so would be beneficial to deplete H* primarily in the region near the IF, and less so in the region near the PF. As the partial pressure of H* is reduced near the IF, the H* flux reaching the molten tin will also be reduced and with it the tin spitting flux.

Stated another way, the following rates relate to the partial pressure of H*:

R1=Rate of H* generation (which will in general be relatively constant for a given EUV intensity and $H_2$ pressure)

R2=Rate of H* arrival (from elsewhere in the vessel to the region of interest)

R3=Net rate of H* entering the molten tin

R4=Rate of H* recombination on the walls of the vessel

R5=Rate of H* recombination due to collision between radicals

R6=Rate of H* being pumped away

The partial pressure of H* in the gas phase is proportional to (R1+R2)−(R3+R4+R5+R6). In a system as disclosed herein, the partial pressure of H* is reduced by incorporating at least one additional H* loss mechanism, thus reducing the extent of tin spitting. This additional H* loss mechanism is reaction of H* in the gas phase. Therefore, if R7=Rate of H* loss due to an added reaction in the gas phase, then the partial pressure of H* in the gas phase becomes proportional to (R1+R2)−(R3+R4+R5+R6+R7).

In addition to H* loss due to the reaction of H* in the gas phase, there may be an another H* reduction/loss mechanism. This is the rate of H* loss at surfaces covered with Sn due to presence of the active gas. The injected active gas may be chosen to react with the Sn liquid layer forming a protective film on top of the liquid tin. The protective film (e.g. some kind oxide) will react with H* impinging the surface forming products which effectively reduces the amount of H* diffusing into the liquid Sn layer. Regarded another way, this may be considered as the active gas which dissolves in the Sn liquid layer changing the properties of the Sn liquid layer in a such why that $H_2$ bubble formation is reduced or suppressed.

The $H_2$ partial pressure in an operating EUV source typically ranges from about 1.3 mbar to about 2.2 mbar, and the mass fraction of H* is far lower than that of $H_2$, so that the partial pressure of H* generated by EUV/$H_2$ interaction can be expected to be much less than about 1 mbar. Stoichiometrically, a very small amount of active gas species injected into the region of interest can be sufficient to react with H* and "steal" a significant amount H* in the region, thus making the contribution of R6 to the overall reduction of H* large.

The active gas can be any one or combination of known species including CO, $CO_2$, $O_2$, methane, a halogen, acetone vapor, $H_2S$, $NO_2$, $N_2$, $NH_3$, $H_2O$, hydrazine, $NF_3$, etc. Other candidate gases are described in W. E. Jones, "The Kinetics of Atomic Hydrogen Reactions in Gas Phase," Chemical Rev., Vol. 73, Number 5, (October 1973), pp. 407-440, the entire contents of which are incorporated by reference herein.

Using $O_2$ as an example, results from experiments using H* to etch tin in an $H_2$ environment at various $O_2$ contamination levels indicate that, at 1.0E-2 mbar (8 mTorr) $O_2$ partial pressure, an eightfold reduction of etch rate is observed as compared to when no $O_2$ is present, indicating that the majority of H* that was available for etching tin in the absence of $O_2$ is being consumed by $O_2$. At 1.7E-2 mbar $O_2$ partial pressure, there is no H* left to etch tin. See J. Sporre et al., "Collector optic in-situ Sn removal using hydrogen plasma," Extreme Ultraviolet (EUV) Lithography IV, Vol. 8679, Jun. 5, 2013, the entire contents of which are incorporated by reference herein.

Figure 4:
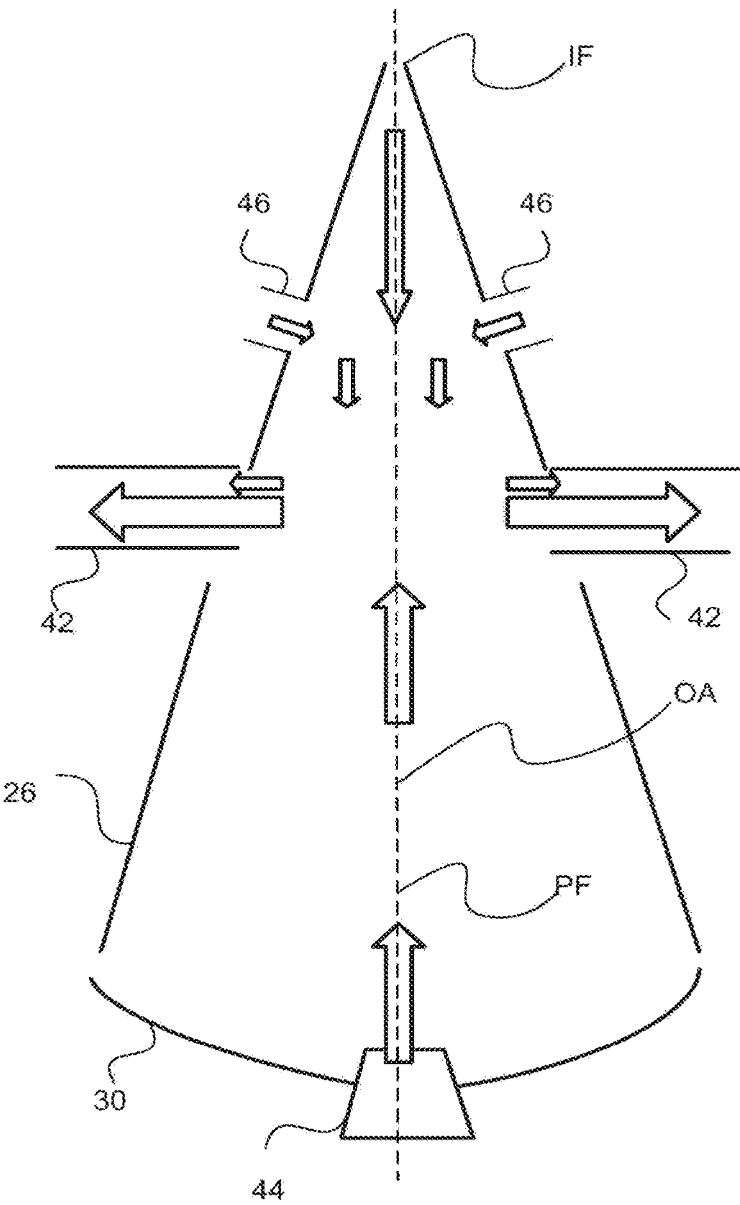
FIG. 4 is a not-to-scale cutaway schematic diagram of a possible arrangement of a vessel and exhaust systems and gas inlets according to an aspect of an embodiment.

The effectiveness of $O_2$ in "stealing" H* can be used to reduce tin passage through the IF by providing inlets for $O_2$ containing gas, in regions near the IF, to lower H* partial pressure there. This is shown in FIG. 4. As shown, gas inlets 46 are provided in a region between the outlets 42 and the intermediate focus IF. The gas inlets 46 are used to introduce the active gas. The flow of the active gas is indicated by the small arrows. The active gas may desirably have a partial pressure in the range of about 10E-2 mbar to about 10E-2 mbar.

Again, instead of or in addition to $O_2$ any other gas or combination of gases that is highly reactive to react and consume H* (to increase R7) may be used as long as it does not have a deleterious effect on EUV transmission. Regarding EUV transmission as function of $O_2$ partial pressure normalized by a total pressure of 1.8 mbar in a $H_2$ and $O_2$ mixture, for example, at 1.0E-2 mbar, >90% transmission is still retained. In practice, the impact to transmission will be less as the active gas species will be only present locally, and not along the entire EUV path length, where for the most part, will still be hydrogen without the active gas species.

Another example of an active gas is methane, $CH_4$. Methane reacts with H* in the reaction $CH_4+H^*=CH_3^*+H_2$.

Also, one of the products of this reaction, CH3*, in turn reacts with tin as follows:

$Sn+4CH_3^*=Sn(CH_3)_4$.

Because $Sn(CH_3)_4$ (tetramethyltin) is gaseous under the conditions in the vessel, it can be pumped away the same as stannane. Thus $CH_4$ steals H*, and, in addition, produces a reactant capable of etching tin. $CH_4$ is an attractive choice for an active gas for this reason and also because it is light so that it has the least negative impact on EUV transmission for a given added amount. $CH_4$ is an attractive choice for an active gas because it is inexpensive, readily available, also a gas commonly used in vacuum deposition processes. The partial pressure of the methane gas may be in the range of about 10E-4 mbar to about 10E-2 mbar.

It should also be noted that any of such specified gases can be injected in to the region of interest in the form of radicals, instead of as molecules.

When the gas exhausts 42 are located between the IF and PF, active gas introduced in the region between the intermediate focus IF and the exhausts 42, that is, the IF region, will be pumped out before reaching the region around and containing the primary focus PF, that is, the PF region. The active gas may be injected in a curtain flow form along the walls towards the exhaust, with relatively low inlet velocity so that the active gas does not overshoot the targeted region. In general, in designing a system for introducing the active gas, it is desirable to ensure that the active gas species does not reach unwanted places.

Figure 5:
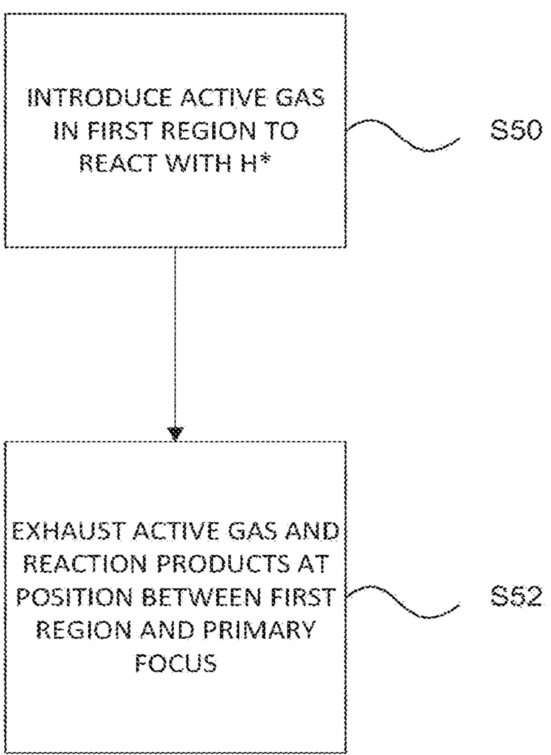
FIG. 5 is a flowchart of a method of reducing contamination from target material spitting according to an aspect of an embodiment.

According to another aspect of an embodiment, disclosed herein is a process for depleting hydrogen radicals to reduce bubble formation in molten tin and the consequent ejection of molten tin in areas where the molten tin may escape the EUV source. An example of such a method is shown in FIG. 5. In a step S50 active gas is introduced into a first region to react with and consume hydrogen radicals there. As disclosed above, this first region may be an IF region around and including the intermediate focus. In a step S52, the active gas and the reaction products are exhausted from the chamber at a position between the first region and the primary focus of a collector in the chamber in such a way that the active gas and reaction products do not reach and interfere with plasma production at the primary focus.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

The implementations may further be described using the following clauses:

1. Apparatus for generating EUV radiation, the apparatus comprising:
 a vessel;
 a collector mirror positioned within the vessel, the collector mirror having an optical axis, a primary focus located in the vessel and on the optical axis, and an intermediate focus on the optical axis;
 at least one exhaust port positioned in a side wall of the vessel beside a first position on the optical axis between the primary focus and the intermediate focus; and
 at least one inlet adapted to be placed in fluid communication with a source of a gas that combines with hydrogen radicals and positioned in the side wall beside a second position on the optical axis between the intermediate focus and first position.

2. Apparatus as in clause 1 wherein the gas comprises oxygen.

3. Apparatus as in clause 2 wherein the gas comprises molecular oxygen.

4. Apparatus as in clause 2 wherein the gas comprises oxygen radicals.

5. Apparatus as in clause 1 wherein the gas comprises methane.

6. Apparatus as in clause 1 wherein the gas comprises molecules of one of CO, $CO_2$, a halogen, acetone vapor, $H_2S$, $NO_2$, $N_2$, $NH_3$, $H_2O$, hydrazine, and $NF_3$.

7. Apparatus as in clause 1 wherein the gas comprises radicals of one of CO, $CO_2$, a halogen, acetone vapor, $H_2S$, $NO_2$, $N_2$, $NH_3$, $H_2O$, hydrazine, and $NF_3$.

8. Apparatus as in clause 1 wherein a partial pressure of the gas is in the range of about 10E-4 mbar to about 10E-2 mbar.

9. Apparatus for generating EUV radiation, the apparatus comprising:
 a vessel;
 a collector mirror positioned within the vessel, the collector mirror having an optical axis and a primary focus located in the vessel and on the optical axis, and an intermediate focus on the optical axis;
 at least one exhaust port positioned in a side wall of the vessel beside a first position on the optical axis between the primary focus and the intermediate focus; and
 at least one inlet adapted to be placed in fluid communication with a source of a gas that combines with hydrogen radicals and positioned in the side wall closer to the exhaust port than to the primary focus.

10. Apparatus as in clause 9 wherein the gas comprises oxygen.

11. Apparatus as in clause 10 wherein the gas comprises molecular oxygen.

12. Apparatus as in clause 10 wherein the gas comprises oxygen radicals.

13. Apparatus as in clause 9 wherein the gas comprises methane.

14. Apparatus as in clause 9 wherein the gas comprises molecules of one of CO, $CO_2$, a halogen, acetone vapor, $H_2S$, $NO_2$, $N_2$, $NH_3$, $H_2O$, hydrazine, and $NF_3$.

15. Apparatus as in clause 9 wherein the gas comprises radicals of one of CO, $CO_2$, a halogen, acetone vapor, $H_2S$, $NO_2$, $N_2$, $NH_3$, $H_2O$, hydrazine, and $NF_3$.

16. Apparatus as in clause 9 wherein a partial pressure of the gas is in the range of about 10E-4 mbar to about 10E-2 mbar.

17. A method of decreasing a partial pressure of hydrogen radicals in a region in a vessel in an EUV source having a reflective optical element in the vessel, the reflective optical element having a primary focus, the method comprising the steps of:

introducing an active gas in the region to participate in a reaction with the hydrogen radicals in which the hydrogen radicals are consumed; and exhausting the active gas and products of the reaction from the vessel at a position between the region and the primary focus.

18. A method as in clause 17 wherein the active gas comprises oxygen.

19. A method as in clause 17 wherein the active gas comprises molecular oxygen.

20. A method as in clause 17 wherein the active gas comprises oxygen radicals.

21. A method as in clause 17 wherein the active gas comprises methane.

22. A method as in clause 17 wherein the active gas comprises molecules of one of CO, $CO_2$, a halogen, acetone vapor, $H_2S$, $NO_2$, $N_2$, $NH_3$, $H_2O$, hydrazine, and $NF_3$.

23. A method as in clause 17 wherein the active gas comprises radicals of one of CO, $CO_2$, a halogen, acetone vapor, $H_2S$, $NO_2$, $N_2$, $NH_3$, $H_2O$, hydrazine, and $NF_3$.

24. A method as in clause 17 wherein a partial pressure of the active gas is in the range of about 10E-4 mbar to about 10E-2 mbar.

25. Apparatus as in clause 1, further comprising the source of gas coupled to the inlet.

26. Apparatus as in clause 9 further comprising the source of gas coupled to the inlet.

Other implementations are within the scope of the claims.

What is claimed is:

1. Apparatus for generating EUV radiation, the apparatus comprising:

a vessel;

a collector mirror positioned within the vessel, wherein the collector mirror has a first focal point and a second focal point, the first focal point being located between the collector mirror and the second focal point;

an exhaust port positioned in a side wall of the vessel to remove an oxygen gas from the vessel prior to the oxygen gas reaching the first focal point; and at least one inlet adapted to be placed in fluid communication with a source of the oxygen gas and positioned in the side wall in a region between the exhaust port and the second focal point.

2. Apparatus as claimed in claim 1 wherein the oxygen gas comprises molecular oxygen.

3. Apparatus as claimed in claim 1 wherein the oxygen gas comprises oxygen radicals.

4. Apparatus as claimed in claim 1 wherein the source of oxygen gas further comprises a source of methane.

5. Apparatus as claimed in claim 1 wherein the source of oxygen gas further comprises a source of one or more of CO, $CO_2$, a halogen, acetone vapor, $H_2S$, $NO_2$, $N_2$, $NH_3$, $H_2O$, hydrazine, and $NF_3$.

6. Apparatus as claimed in claim 1 wherein the source of oxygen gas further comprises a source of radicals of one or more of CO, $CO_2$, a halogen, acetone vapor, $H_2S$, $NO_2$, $N_2$, $NH_3$, $H_2O$, hydrazine, and $NF_3$.

7. Apparatus as claimed in claim 1 wherein a partial pressure of the oxygen gas is in a range of about 10E-4 mbar to about 10E-2 mbar.

8. Apparatus for generating EUV radiation, the apparatus comprising:

a vessel;

a collector mirror positioned within the vessel, the collector mirror having a primary focus;

at least one exhaust port positioned in a side wall of the vessel to remove an oxygen gas from the vessel prior to the oxygen gas reaching the primary focus; and at least one inlet adapted to be placed in fluid communication with a source of the oxygen gas and positioned in the side wall closer to the at least one exhaust port than to the primary focus.

9. Apparatus as claimed in claim 8 wherein the oxygen gas comprises molecular oxygen.

10. Apparatus as claimed in claim 8 wherein the oxygen gas comprises oxygen radicals.

11. Apparatus as claimed in claim 8 wherein the source of oxygen gas further comprises a source of methane.

12. Apparatus as claimed in claim 8 wherein the source of oxygen gas further comprises a source of one or more of CO, $CO_2$, a halogen, acetone vapor, $H_2S$, $NO_2$, $N_2$, $NH_3$, $H_2O$, hydrazine, and $NF_3$.

13. Apparatus as claimed in claim 8 wherein the source of oxygen gas further comprises a source of radicals of one or more of CO, $CO_2$, a halogen, acetone vapor, $H_2S$, $NO_2$, $N_2$, $NH_3$, $H_2O$, hydrazine, and $NF_3$.

14. Apparatus as claimed in claim 8 wherein a partial pressure of the oxygen gas is in a range of about 10E-4 mbar to about 10E-2 mbar.

15. Apparatus for generating EUV radiation, the apparatus comprising:

a vessel;

a collector mirror positioned within the vessel, wherein the collector mirror has a first focal point within the vessel where target material may be irradiated to produce plasma and a second focal point, the first focal point being located between the collector mirror and the second focal point;

an exhaust port positioned in a side wall of the vessel; and at least one inlet adapted to be placed in fluid communication with a source of oxygen gas and positioned in the side wall in a region between the exhaust port and the second focal point.

16. Apparatus as claimed in claim 15 wherein the oxygen gas comprises molecular oxygen.

17. Apparatus as claimed in claim 15 wherein the oxygen gas comprises oxygen radicals.

18. Apparatus as claimed in claim 15 wherein the source of oxygen gas further comprises a source of methane.

19. Apparatus as claimed in claim 15 wherein the source of oxygen gas further comprises a source of one or more of CO, $CO_2$, a halogen, acetone vapor, $H_2S$, $NO_2$, $N_2$, $NH_3$, $H_2O$, hydrazine, and $NF_3$.

20. Apparatus as claimed in claim 15 wherein the source of oxygen gas further comprises a source of radicals of one or more of CO, $CO_2$, a halogen, acetone vapor, $H_2S$, $NO_2$, $N_2$, $NH_3$, $H_2O$, hydrazine, and $NF_3$.

* * * * *